United States Patent [19]
Murphy

[11] Patent Number: 5,917,703
[45] Date of Patent: Jun. 29, 1999

[54] INTEGRATED CIRCUIT INTERCOUPLING COMPONENT WITH HEAT SINK

[75] Inventor: James V. Murphy, Warwick, R.I.

[73] Assignee: Advanced Interconnections Corporation, West Warwick, R.I.

[21] Appl. No.: 09/062,215

[22] Filed: Apr. 17, 1998

[51] Int. Cl.$^6$ ................................................. H05K 7/20
[52] U.S. Cl. ...................... 361/704; 361/707; 361/709; 361/719; 257/718; 257/719; 174/16.3; 165/80.2; 165/80.3
[58] Field of Search ................................. 361/690, 702, 361/704, 707, 709, 717–719; 257/718, 719; 174/16.3; 165/80.2, 80.3, 185, 104.33

[56] References Cited

U.S. PATENT DOCUMENTS

| | | |
|---|---|---|
| 2,879,977 | 3/1959 | Trought . |
| 3,293,590 | 12/1966 | Woolsey . |
| 4,004,195 | 1/1977 | Harayada et al. . |
| 4,338,652 | 7/1982 | Romanczuk et al. . |
| 4,342,068 | 7/1982 | Kling . |
| 4,394,530 | 7/1983 | Kaufman . |
| 4,539,621 | 9/1985 | Currier . |
| 4,739,447 | 4/1988 | Lecomte . |
| 4,769,557 | 9/1988 | Houf et al. . |
| 4,802,532 | 2/1989 | Dawes et al. . |
| 4,953,060 | 8/1990 | Lauffer et al. . |
| 4,965,658 | 10/1990 | Norbeck et al. . |
| 4,974,119 | 11/1990 | Martin . |
| 5,019,940 | 5/1991 | Clemens ................................. 361/719 |
| 5,065,281 | 11/1991 | Hernandez et al. . |
| 5,159,532 | 10/1992 | Kilian et al. . |
| 5,168,425 | 12/1992 | Radack, Jr. . |
| 5,305,185 | 4/1994 | Samarov et al. . |
| 5,306,546 | 4/1994 | Schreiber et al. . |
| 5,469,330 | 11/1995 | Karabatsos et al. ..................... 361/704 |
| 5,652,463 | 7/1997 | Weber et al. ............................ 361/719 |
| 5,671,121 | 9/1997 | McMahon ................................ 361/719 |
| 5,734,555 | 3/1998 | McMahon ................................ 361/704 |

OTHER PUBLICATIONS

Vemaline Brochure (8 pages).

*Primary Examiner*—Leo P. Picard
*Assistant Examiner*—Boris L. Chervinsky
*Attorney, Agent, or Firm*—Fish & Richardson P.C.

[57] ABSTRACT

An intercoupling component (e.g., socket or adapter) is provided for increasing the dissipation of heat generated within an integrated circuit (IC) array positioned within the intercoupling component, while maintaining a relatively low profile. The intercoupling component includes a heat sink positioned within the package support member, and having an upper surface in contact with a lower surface of the integrated circuit package disposed within the package support member. The package support member includes contact terminals disposed within associated openings of the package for electrically connecting the contacting areas of the integrated circuit package to the corresponding connection regions of the substrate. The openings extend from an upper surface to an opposite lower surface of the support member and are located in a pattern corresponding to a pattern of the connection contacts. The heat sink may be configured to be removable and replaceable.

24 Claims, 9 Drawing Sheets

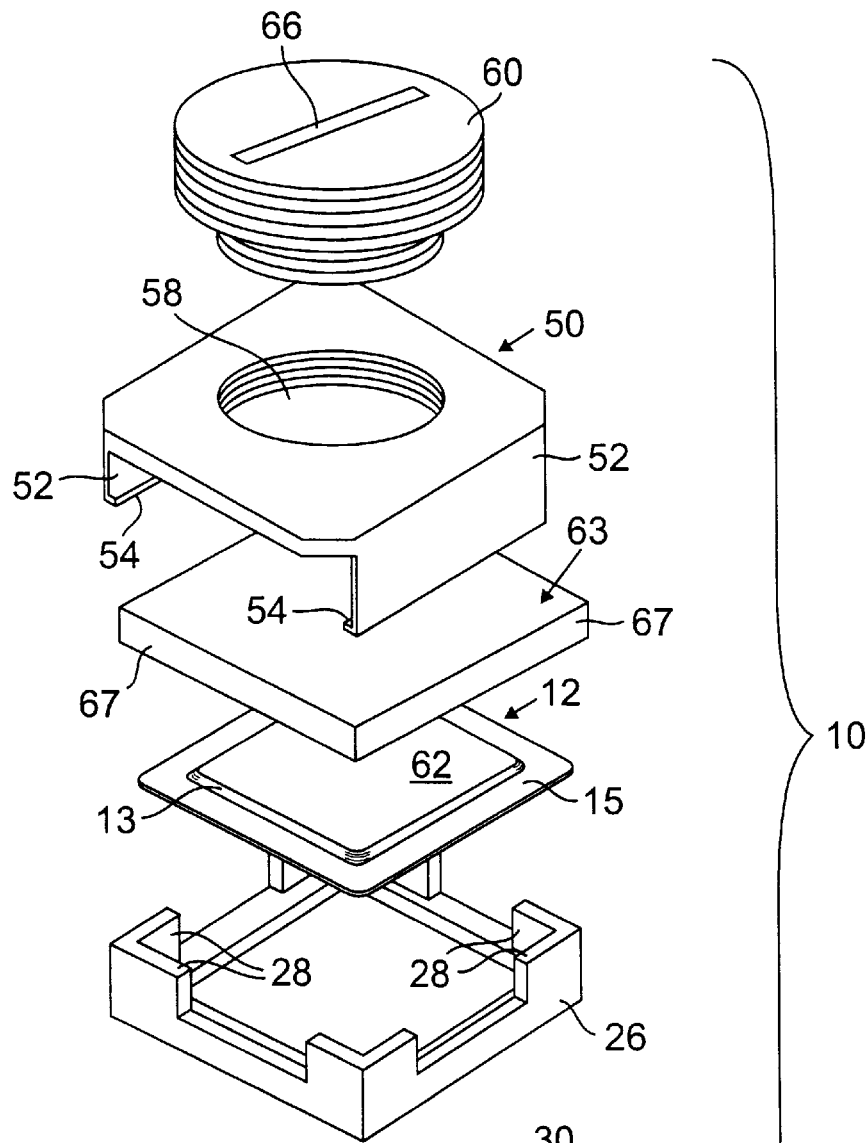
FIG. 1
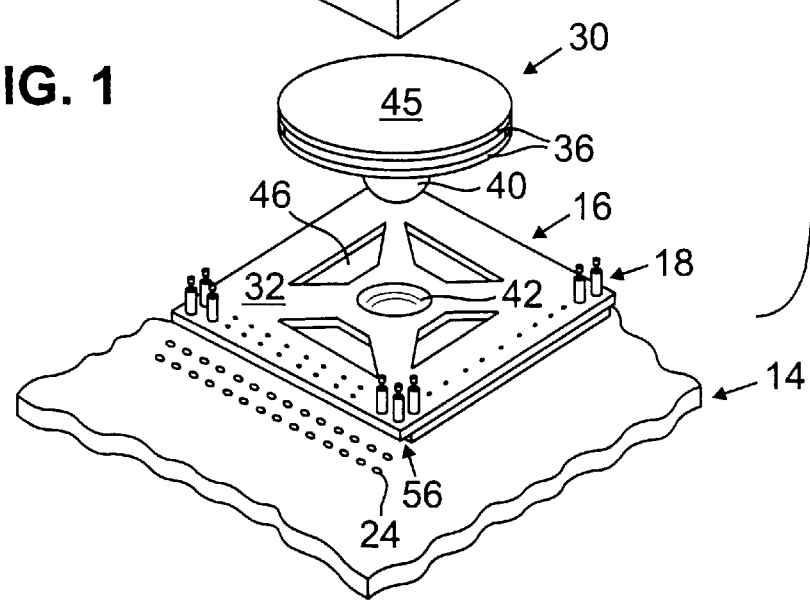

INTEGRATED CIRCUIT INTERCOUPLING COMPONENT WITH HEAT SINK

BACKGROUND OF THE INVENTION

This invention relates to removing heat from integrated circuit (IC) array packages.

As the densities of integrated circuits (e.g., microprocessors, gate arrays, ASICs) continue to increase, the size of the packages used to house the circuits continue to shrink. These smaller, higher performing integrated circuits generate tremendous amounts of heat which is required to be dissipated. Thus, externally mounted heat sinks with profiles having large surface areas are typically mounted on the IC packages. In some cases, the size of the heat sink mounted to the IC package can dwarf the size of the package itself.

IC packages are either connected directly to circuit boards, or through adapters or sockets. Adapters and sockets are described in Advanced Interconnections Catalog No. 14-A (available from 5 Energy Way, West Warwick, R.I. 02893). In general, they consist of a glass epoxy frame having pins which are used to electrically connect a PC board with an IC or other electrical component.

Adapters are used to permanently convert one type of package to another. For example, a ball grid array (BGA) package having rounded solder ball contacts may be soldered to an adapter array having terminals pins, thereby converting the BGA package to a pin grid array (PGA) package.

Sockets, on the other hand, are used to allow particular IC packages to be interchanged without permanent connection to a circuit board. More recently, sockets for use with PGA, BGA and LGA packages have been developed to allow these packages to be non-permanently connected (e.g., for testing) to a circuit board.

SUMMARY OF THE INVENTION

This invention features an intercoupling component (e.g., socket or adapter) for increasing the dissipation of heat generated within an integrated circuit (IC) array package positioned within the intercoupling component, while maintaining a relatively low profile. The integrated circuit array package also provides a reliable, non-permanent and low-loss electrical interconnection between electrical contacting areas of the IC array package and connection regions of a substrate (e.g., printed circuit board). The term "integrated circuit array package" is intended to mean those packages, including PGA (pin grid array), PQFP (plastic quad flat pack), BGA (ball grid array) and LGA (land grid array) packages. The term "substrate" is intended to mean any base member having electrical contact areas including printed circuit boards, IC chip substrates or the packages supporting such chip substrates.

In one aspect of the invention, the intercoupling component includes a heat sink, removable and replaceable within a package support member, having a surface in contact with a surface of the IC array package which is also disposed within the package support member. The package support member includes contact terminals disposed within associated openings of the package for electrically connecting the contacting areas of the IC array package to the corresponding connection regions of the substrate. The openings extend from an upper surface to an opposite lower surface of the support member and are located in a pattern corresponding to a pattern of the connection contacts.

In one embodiment, of the invention the surfaces of the heat sink and IC array package in contact with each other are the upper and lower surfaces of the heat sink and IC array package, respectively. Other embodiments of this aspect of the invention may include a pivoting mechanism to allow the upper surface of the heat sink to maintain flat-to-flat contact with a lower surface of the integrated circuit package. The pivoting mechanism, in essence, compensates for the lack of coplanarity between upper and lower surfaces of the IC package and any irregularities on those surfaces. Thus, surface-to-surface contact between the heat sink and IC package is maximized, thereby improving heat transfer therebetween.

An intercoupling component having this arrangement is dual-purposed in that the component serves to reliably interconnect (either temporarily or permanently) the IC package to a printed circuit board while supporting a removable and replaceable heat sink within the component. The ability to remove and replace the heat sink facilitates interchanging heat sinks whose size and shape may differ on the basis of the operating characteristics (e.g., power level) of the integrated circuit placed within the package support member of the intercoupling component.

In another aspect of the invention, the intercoupling component includes a heat sink positioned within a package support member and the pivoting mechanism to allow the upper surface of the heat sink to maintain flat-to-flat contact with a lower surface of the integrated circuit package. The package support member includes contact terminals disposed within associated openings of the package for electrically connecting the contacting areas of the IC array package to the corresponding connection regions of the substrate. The openings extend from an upper surface to an opposite lower surface of the support member and are located in a pattern corresponding to a pattern of the connection contacts.

Embodiments of both aspects of the invention may include one or more of the following features. The package support member includes a central region within which the heat sink is positioned with the openings disposed along an outer periphery of the central region.

A lower surface of the heat sink includes a projecting member and the upper surface of the support member includes a depression sized and shaped to receive the projecting member. In one embodiment, the depression is concave-shaped and the projecting member is rounded. This arrangement provides a ball and socket for allowing the heat sink to swivel and tilt with respect to the contacting surface of the IC package.

The intercoupling component further includes a retaining member positioned to apply a downward force on the integrated circuit package. The retaining member includes a second, upper heat sink having a surface contacting an upper surface of the IC package. This arrangement, provides upper and lower heat sinks which "sandwich" the IC package so that a greater amount of heat can be dissipated from the IC package. A rigid member having peripheral sidewalls is positioned between the retaining member and integrated circuit package. The peripheral sidewalls contact peripheral regions of the integrated circuit package. With this arrangement, stress applied to the body portion of the IC package is relieved by conveying the downward force applied by the retaining member to the peripheral sidewalls contacting the peripheral regions of the IC package 12. The package support member includes at least one aperture for providing air flow to the lower surface of the heat sink.

The intercoupling component includes an electrically insulative locator sheet (e.g., polyimide) including an aperture extending therethrough from an upper surface to an opposite lower surface of the locator sheet. The aperture is positioned and sized to engage an upper peripheral portion of the heat sink. The electrically insulative locator sheet includes openings extending therethrough and located in a pattern corresponding to a pattern of the contact terminals. The openings are sized to allow the contact terminals to pass through the upper and lower surfaces of associated openings, whereby the contact terminals are aligned with associated connection regions of the substrate.

The contact terminals each include a socket body having an upper end with an opening and a lower end configured to contact the corresponding connection region of the printed circuit board. Each contact terminals further include a pin having an upper end adapted to contact the electrical contacting area of the IC package and a lower end configured to be inserted within the opening of the socket body. The pins are disposed within holes of an electrically insulative support member, thereby providing an adapter assembly received by a socket assembly which supports the socket bodies. A contact spring may be disposed within a first end of the opening of the socket body to receive and apply a frictional force sufficient to retain the lower end of the pin within the opening of the socket body. A resilient member can also be disposed within a second, opposite end of the opening, to apply, to the lower end of the pin and in response to a downward force applied to the pin, an upward force sufficient to overcome the frictional force of the contact spring.

Other features of the invention will be apparent from the following description of the preferred embodiments and from the claims.

BRIEF DESCRIPTION OF THE DRAWINGS

FIG. 1 is an exploded, somewhat diagrammatic, isometric view of an intercoupling component assembly, an integrated circuit package, heat sink, and hold-down assembly positioned over a printed circuit board.

DESCRIPTION

Figure 2:
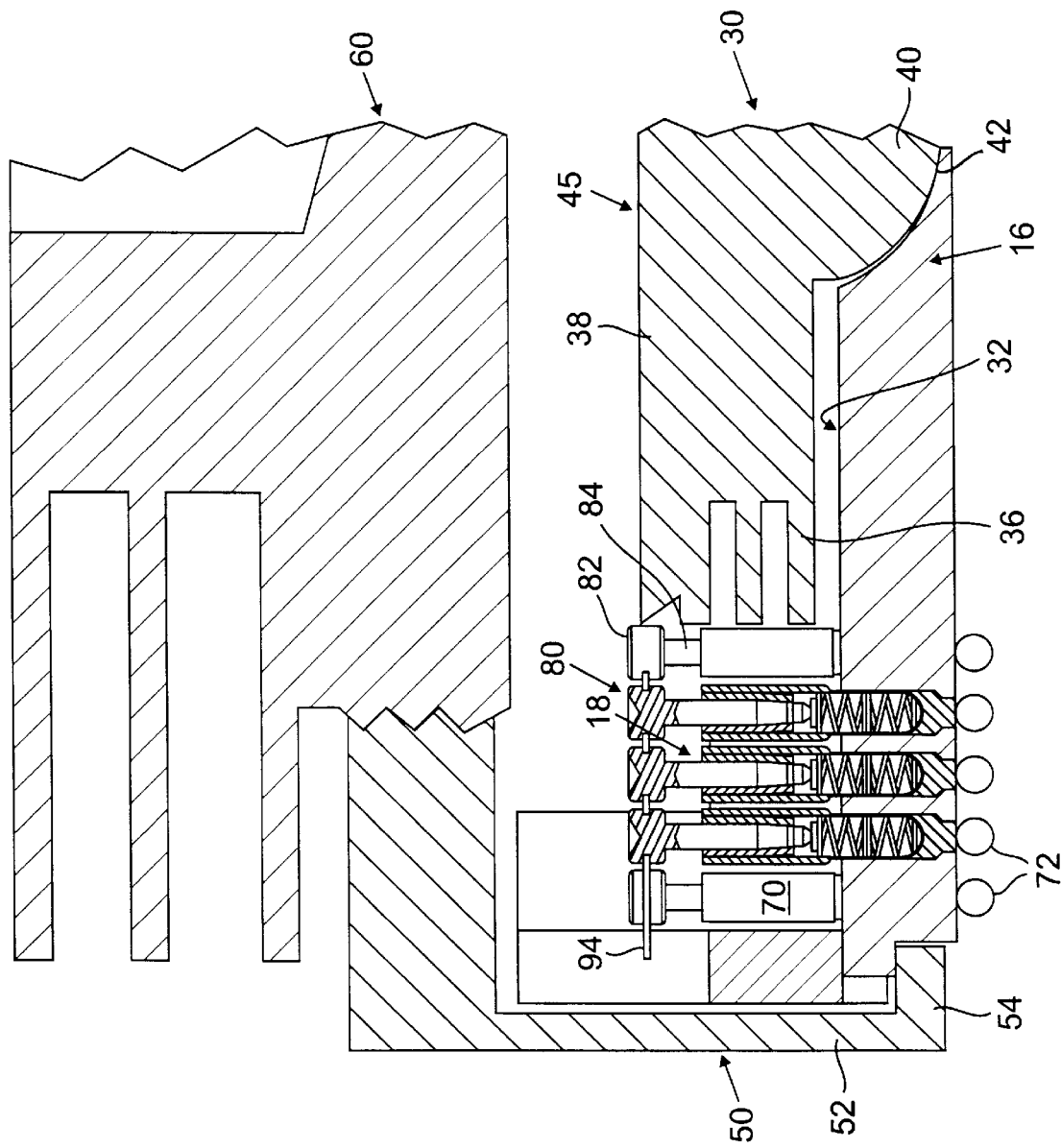
FIG. 2 is a cross-sectional side view of a portion of the intercoupling component assembly of FIG. 1.

Referring to FIGS. 1 and 2, a socket converter assembly 10 for intercoupling an IC package 12 to a printed circuit board 14 is shown. In this embodiment, IC package 12 is in the form of a BGA package having a number of rounded solder balls 22 (FIG. 4) attached to contacts on the undersurface of the package. Socket converter assembly 10, which serves as an intercoupling component, includes a package support member in the form of an electrically insulative member 16 for supporting converter socket terminals 18, each of which is press-fit within a corresponding one of an array of holes 20 (FIG. 3) in the insulative member. The array of holes 20 are provided in a pattern corresponding to a footprint of the solder balls 22 of package 12 as well as a footprint of surface mount pads 24 of printed circuit board 14. Insulative member 16 with converter socket terminals 18 is press-fit into a guide box 26 having alignment members 28 along which the peripheral edges of IC package 12 are guided so that solder balls 22 are aligned over converter socket terminals 18. In particular embodiments, insulative member 16 and guide box 26 may be formed as a one-piece, integral unit.

Socket converter assembly 10 also includes a lower heat sink 30 positioned between an upper surface 32 of insulative member 16 and an undersurface 34 (FIG. 8C) of IC package 12. Spaced fins 36 extend radially from a central body 38 (FIG. 2) of the lower heat sink. Lower heat sink 30 includes a ball member 40 sized and shaped to be received within a corresponding concave-shaped cavity 42 (FIGS. 2 and 3) formed on upper surface 32 of insulative member 16. Lower heat sink 30 provides a thermal path from undersurface 34 of IC package 12 to an upper surface 45 of heat sink 30 for dissipating heat generated within IC package 12. Ball member 40 and cavity 42 serve to provide a ball and socket joint for allowing heat sink 30 to swivel and tilt at least 10° in any direction. Thus, as will be described in greater detail below, when IC package 12 is positioned over and into contact with lower heat sink 30, the heat sink can swivel and tilt to compensate for irregularities and lack of coplanarity between upper surface 62 and under surface 34 of IC package 12. The ball and socket joint arrangement, therefore, maximizes surface-to-surface contact between lower heat sink 30 and IC package 12, thereby improving heat transfer between the surfaces and providing a more efficient heat sink.

Figure 3:
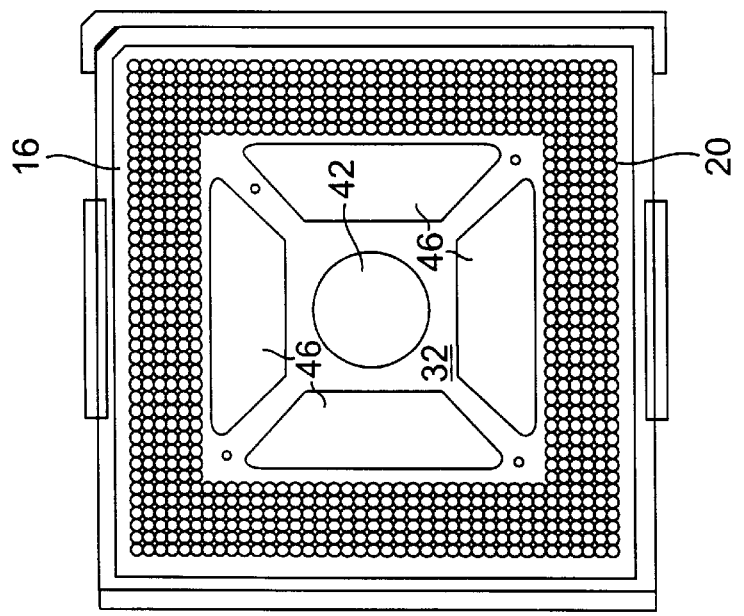
FIG. 3 is a bottom view of the insulative support member of FIG. 1.

Referring to FIG. 3, insulative support member 16 also includes openings 46, positioned between cavity 42 and array of holes 20, for providing airflow access to the undersurface of lower heat sink 30.

Referring again to FIGS. 1 and 2, socket converter assembly 10 also includes a hold-down cover 50 for securing the IC package 12 into the socket converter assembly. Cover 50 includes a pair of opposite walls 52 having tab members 54 which engage recessed portions 56 along the underside of insulative member 16. As will be described in greater detail below, in some embodiments, a stiffening member 63 formed of a rigid material (e.g., aluminum) may be positioned between cover 50 and IC package 12. Hold-down cover 50 includes a threaded thru-hole 58 which threadingly receives an upper heat sink 60 to dissipate heat passing through stiffening member 63 from an upper surface 62 of IC package 12. A slot 66 formed in the heat sink facilitates threading the heat sink within the cover, for example, with a screwdriver or coin. Other latching mechanisms (e.g., clips or catches) may also be used to secure IC packages within the socket converter assembly. It is also appreciated that other heat sink arrangements, including those with increased surface area (e.g. heat sinks with fans), may be substituted for the finned version shown in FIGS. 1 and 2. In certain lower power applications, upper heat sink 60 may not be required with only cover 50 providing the downward compressing force to IC package 12.

Stiffening member 63 resembles a box having a cavity 65 defined by peripheral walls 67 for receiving body portion 13 of IC package 12. As described in greater detail below, in conjunction with FIGS. 8A–8C, stiffening member 63 relieves stress applied to body portion 13 by conveying the downward force applied by cover 50 to peripheral walls which, in turn, transfers the force to peripheral region 15 of IC package 12 (FIGS. 1 and 8C).

Figure 4:
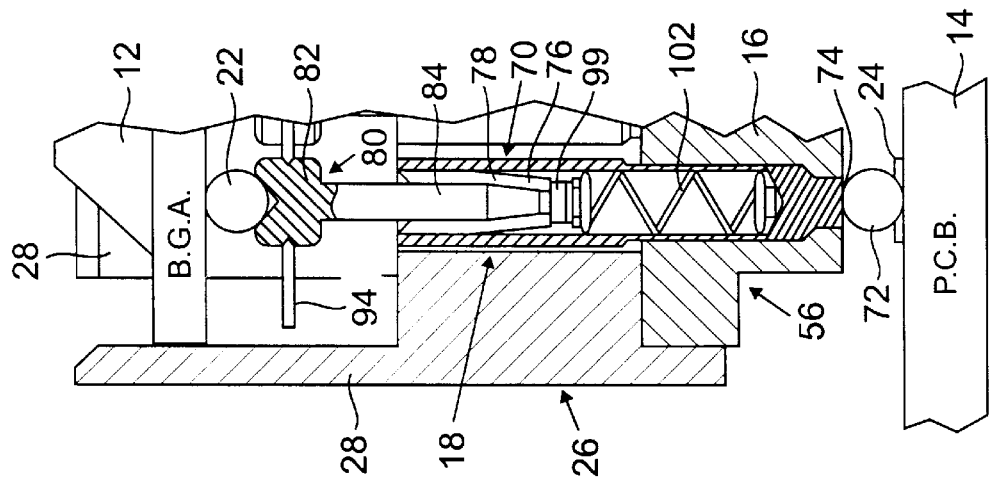
FIG. 4 is a cross-sectional side view of an enlarged portion of the intercoupling component assembly of FIG. 2.

Referring to FIG. 4, each converter socket terminal 18 includes a female socket 70 positioned within one of the array of holes 20 of insulative member 16. Female socket 70 includes a solder ball 72 pre-attached (e.g., by soldering) to its bottom end 74 to provide an identical mating condition to surface mount pads 24 as would have been the case had IC package 12 been connected directly to the printed circuit board 14. Solder balls 72 are eventually soldered to corresponding surface mount pads 24 of circuit board 14. Positioned within the interior of female socket 70 is a contact spring 76 press-fit within the interior and upper end of the female socket.

Each contact spring 76 includes spring leaves 78 attached at circumferentially spaced points of an upper end of a barrel 79. Contact spring 76 is sized to receive a male terminal 80 which passes through barrel 79 to frictionally engage spring leaves 78. Contact springs of this type are commercially available from Advanced Interconnections, West Warwick R.I. or other stamping outfits providing such contact springs (e.g., in an open-tooling arrangement). Spring leaves 78 provide a "wiping", reliable electrical contact to the male terminal pins by applying a frictional force in a direction substantially transverse to the longitudinal axis of the male terminals sufficient to ensure good electrical contact. A more detailed description of converter socket terminal 18 and its parts is found in co-pending application Ser. No. 08/694,740 which is assigned to the assignee of the present invention and incorporated herein by reference.

Each male terminal 80 has a head 82 adapted to receive a corresponding ball 22 of the IC package 12 and a pin 84, thereby forming an electrical connection between ball 22 of package 12 and solder ball 72 of converter socket terminal 18. Head 82 has a concave upper surface 87 for accommodating the rounded shape of solder ball 22

Figure 5:
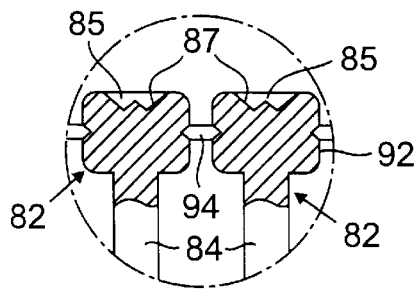
FIG. 5 is an enlarged version of a portion of a male terminal pin used within the intercoupling component assembly of FIG. 1.

Referring to FIG. 5, in an alternative embodiment, concave upper surface 87 includes a relatively sharp projection 85 disposed concentrically on the upper surface of the head. Projection 85 is used to pierce the outer surface of the IC package's solder balls 22 which, due to exposure to the atmosphere, may have a layer of oxidation. Projection 85 is positioned at the lowest point within upper surface 87 with the tip of the projection substantially below the plane defined by the outer peripheral edge of head 82. Thus, projection 85 is protected during tumbling operations, commonly performed on machined parts to remove sharp and irregular edges. Other approaches for improving the electrical connection between solder balls 22 and socket terminal 18 may be used including the use of particle interconnection (PI) contacts. As described in U.S. Pat. No. 5,083,697 (incorporated by reference), particle interconnection contacts include relatively hard metallized particles deposited in a soft metal layer such that they protrude from the surface of the contact. When a second contacting surface (e.g., ball) is compressively brought into contact with the PI contact, the hard particles penetrate any oxides and contamination present on the contacting surface. PI contacts minimize the resistance between the contacts, particularly after repeated insertions. Alternatively, a dendritic growth process may be used to improve the conductivity between contacts. Head 82 of each male terminal 80 also includes a V-groove 92 used to capture a relatively thin polymeric sheet 94 made, for example from Kapton® (a product of E.I. DuPont de Nemours and Co., Wilmington, Del.).

Figure 6:
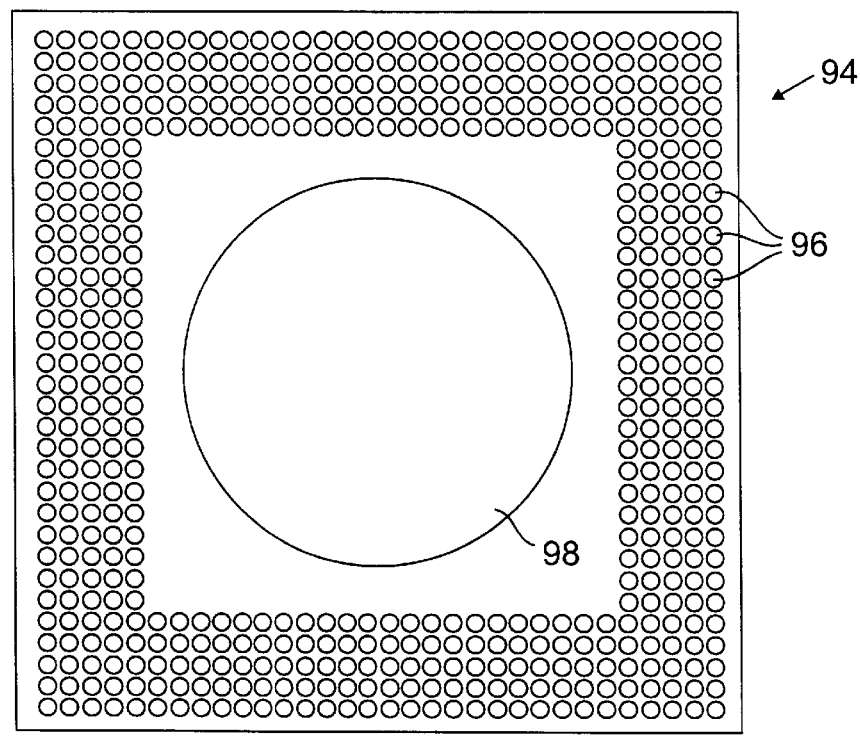
FIG. 6 is a top view of the polymeric sheet layer of FIG. 2.

Referring to FIG. 6, sheet 94 has a thickness of about 5 mils and includes openings 96 sized slightly smaller than the diameter of the heads 82. This arrangement maintains male terminals 80 together in proper spaced relationship so that the pins can be easily aligned over and inserted into female sockets 70. Sheet 94 also prevents tilting of the pins which can cause electrical shorting. Sheet 94 also includes an opening 98 to allow heat sink 30 to be retained in insulative member 16.

Figure 7:
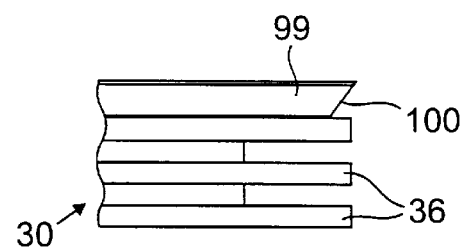
FIG. 7 is an enlarged version of a portion of the lower heat sink of the intercoupling component assembly of FIG. 1.

Referring to FIG. 7, an upper end 99 of heat sink 30 includes a bevelled upper peripheral edge 100 which is received by opening 98. Opening 98 in sheet 94 is sized to be slightly smaller than upper end 99 of heat sink 30 and has sufficient flexibility for allowing it to be fitted around the upper end of the heat sink.

Each of pins 84 are received within corresponding contact springs 76 with spring leaves 78 configured to provide a lateral force, generally transverse to the longitudinal axis of pins 84, thereby frictionally engaging outer surfaces of the pins.

In one embodiment, the lower end of pin 84 includes a flattened head 99 having a diameter slightly larger than the diameter of pin 84 so that after head 99 passes through spring leaves 78 of contact spring 76, male terminal 80 is captured within female socket 70.

Metallic coiled springs 102 are loosely positioned within the interiors of each of female sockets 70 and provide an upward force to the lower ends of pins 84. As mentioned earlier, spring leaves 78 of contact springs 76 provide a sufficient amount of lateral frictional force generally transverse to the longitudinal axis of the pins, to ensure a reliable electrical contact to pins 84 of male terminals 80. However, when hold-down cover 50 is removed from insulative member 16, guide box 26 and IC package 12, metallic coiled springs 102 expand causing each of male terminals 80 to release and extend to their most upper vertical position within female sockets 70. Thus, it is important that coiled springs 102 provide an upward force to male terminal pins 80 that overcomes the frictional force, transverse to the upward force, applied by spring leaves 78. The upward force of coiled springs 102 also minimizes the risk of pins 84 "sticking" within corresponding female sockets 70.

Figure 8A:
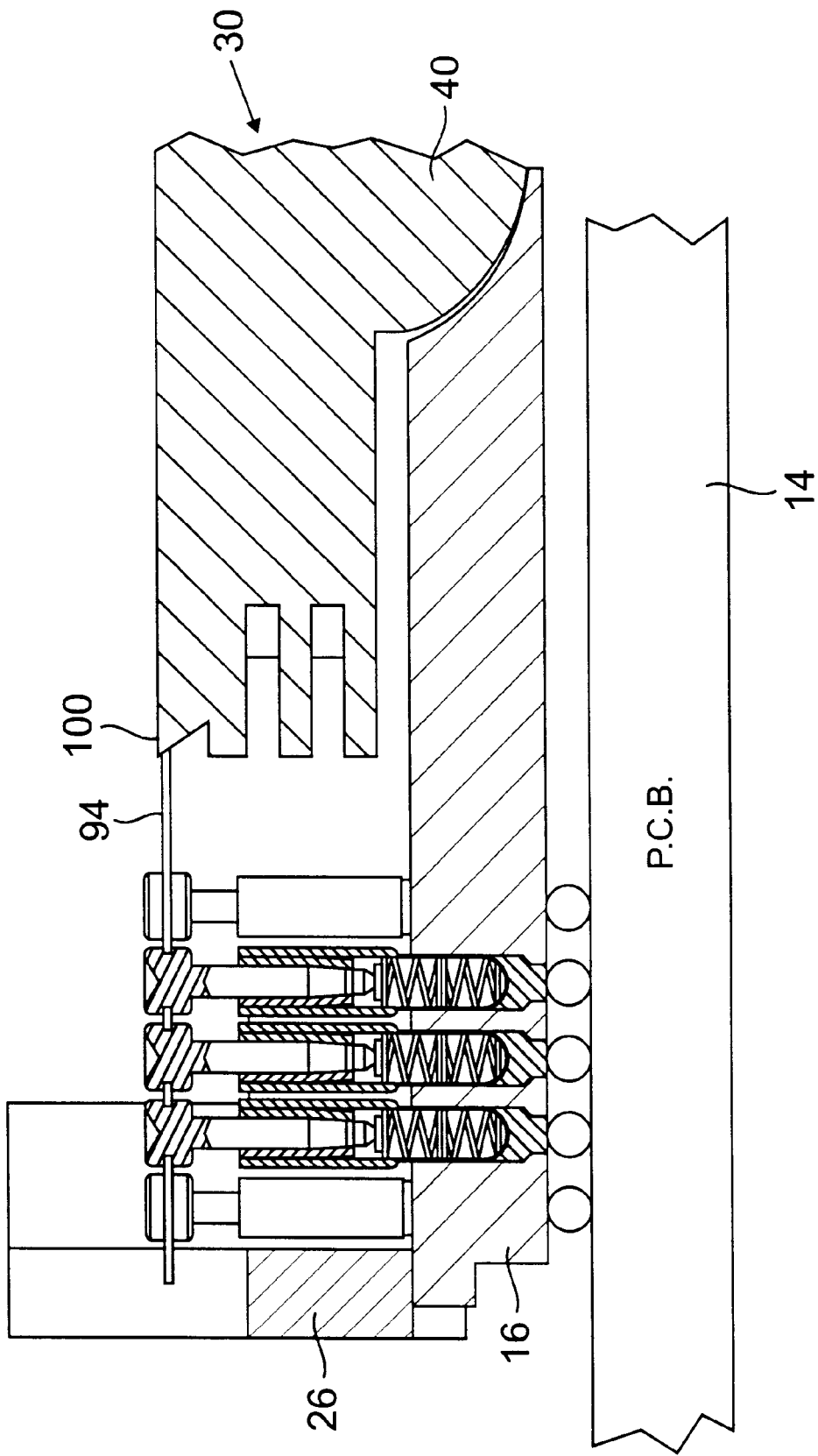
FIGS. 8A–8C are cross-sectional side views illustrating the operation of the intercoupling component assembly.
Figure 8B:
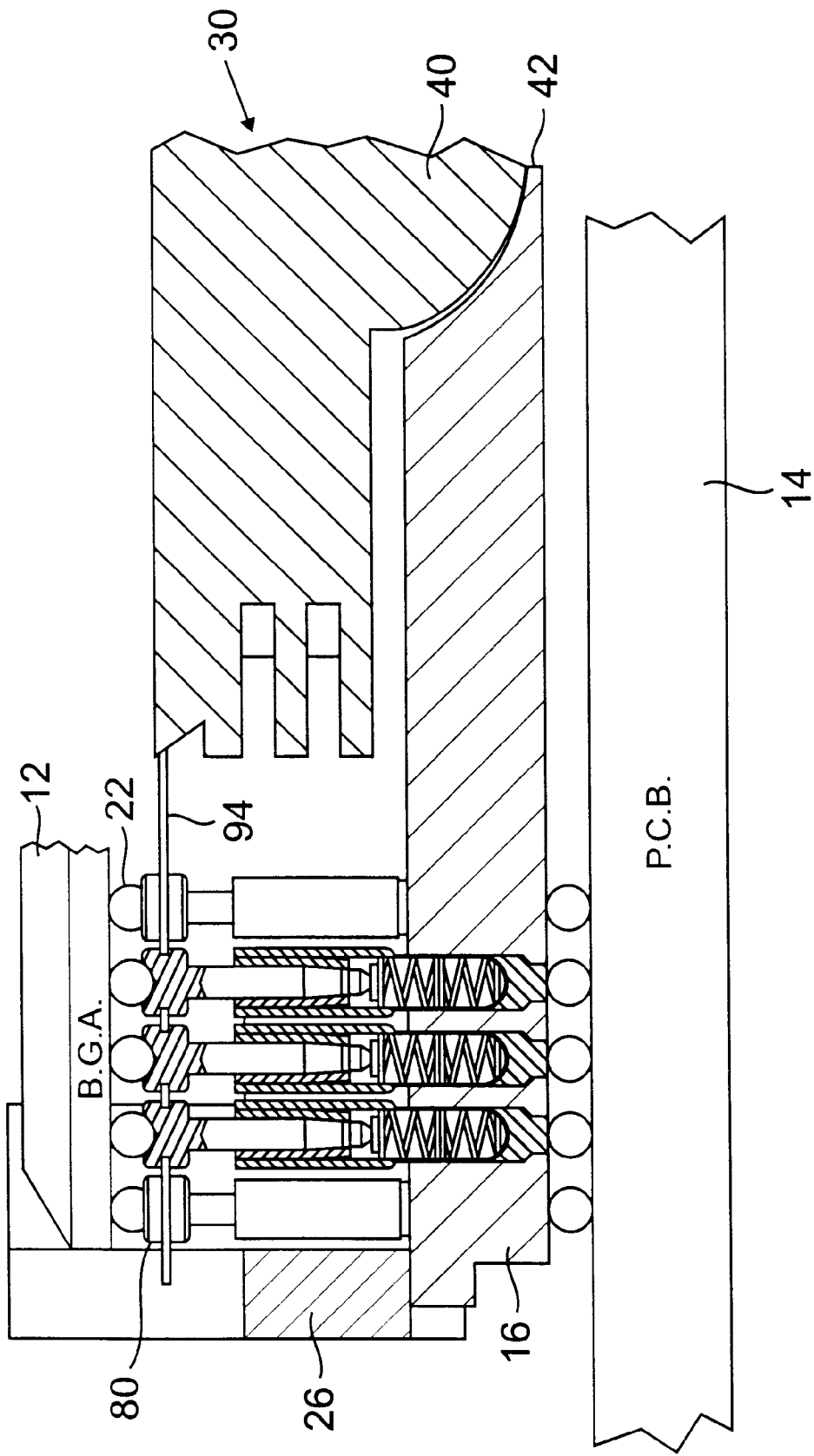
Figure 8C:
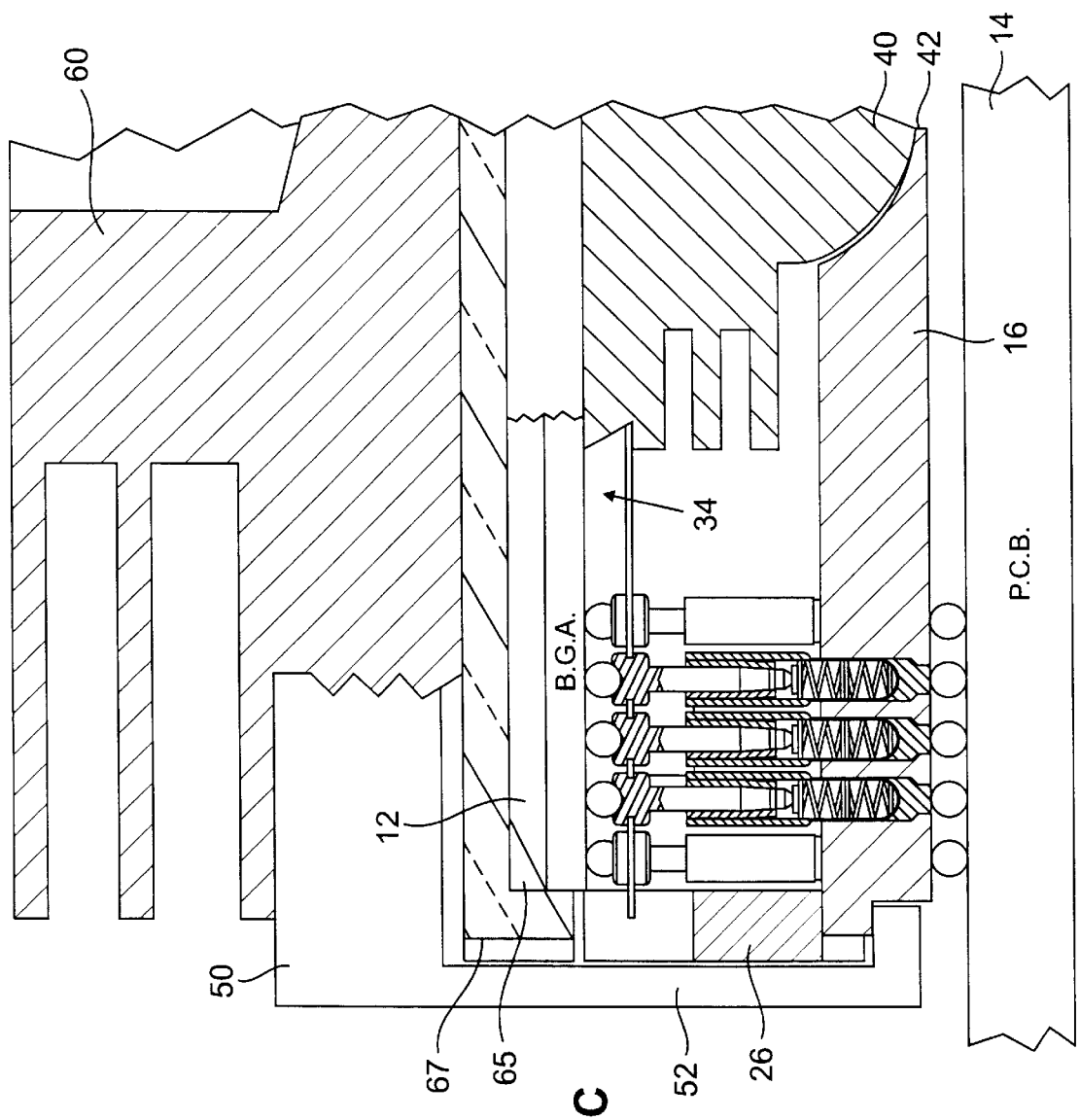

FIGS. 8A–8C illustrate the operation of socket converter assembly 10. Referring to FIG. 8A, heat sink 30 is positioned within sheet 94, with ball member 40 seated within cavity 42 of insulative member 16. The height and pitch of upper peripheral edge 100 is selected to initially capture heat sink 30 within insulative member 16 prior to IC package 12 being seated in its final position within socket converter assembly 10.

Referring to FIG. 8B, IC package 12 is positioned within guide box 26 using alignment members 28 of guide box 26, and over insulative member 16 with solder balls 22 of IC package 12 resting on concave upper surface 87 of male terminals 80 In this position, male terminals 80 vertically extend from contact springs 76 to their greatest degree.

Referring to FIG. 8C, cover 50 is slid over insulative member 16, guide box 26, stiffening member 63, and IC package 12. Upper heat sink 60 is then rotated within cover 50 using slot 66 until the upper heat sink contacts stiffening member 63. Further rotation of heat sink 60 applies a downward force to stiffening member 63 which, in turn, transfers the force to peripheral region 15 of IC package 12, thereby causing male terminal pins 84 to extend within female sockets 70 and against the bias of spring coils 102. Thus, electrical interconnections are completed from each of solder balls 22 of IC package 12 to corresponding pads 24 of board 14, after solder balls 72 have been soldered to pads 24. When IC package 12 is lowered by the compressing force applied by upper heat sink 60, sheet 94 is also lowered and moves away from the upper end of upper peripheral edge 100 allowing heat sink 30 to freely swivel within cavity 42 of insulative member 16. At the same time, the downward force applied by upper heat sink 60 causes IC package 12 to be compressed against upper surface 45 of lower heat sink 30. Ball member 40 of lower heat sink 30 is able to swivel and tilt within cavity 42 of insulative member 16 to maximize contact between upper surface 45 of lower heat sink 30 and lower surface 34 of IC package 12.

Raising upper heat sink 60 from cover 50 removes the downward force applied to IC package 12 with spring coils 102 returning male terminal pins 84 to their fully extended vertical position of FIG. 8B. With upper heat sink 60 in its raised position, cover 50 can be removed to allow, for example, substituting a different IC package within the BGA converter socket assembly. The likelihood that one or more of male terminal pins 84 becoming stuck within female socket 70 is minimized because the pins are "ganged" together by polymeric sheet 94 which assists in ensuring that all of the pins return to their vertically extended position and at a consistent height.

It is also important to note that each time an IC package is secured within socket converter assembly 10, pins 84 of male terminals 80 are "wiped" against spring leaves 78 of contact spring 76 to remove oxidation and ensure a reliable electrical connection therebetween.

Other embodiments are within the following claims. For example, the invention is applicable to other socket and adapter assemblies.

Figure 9:
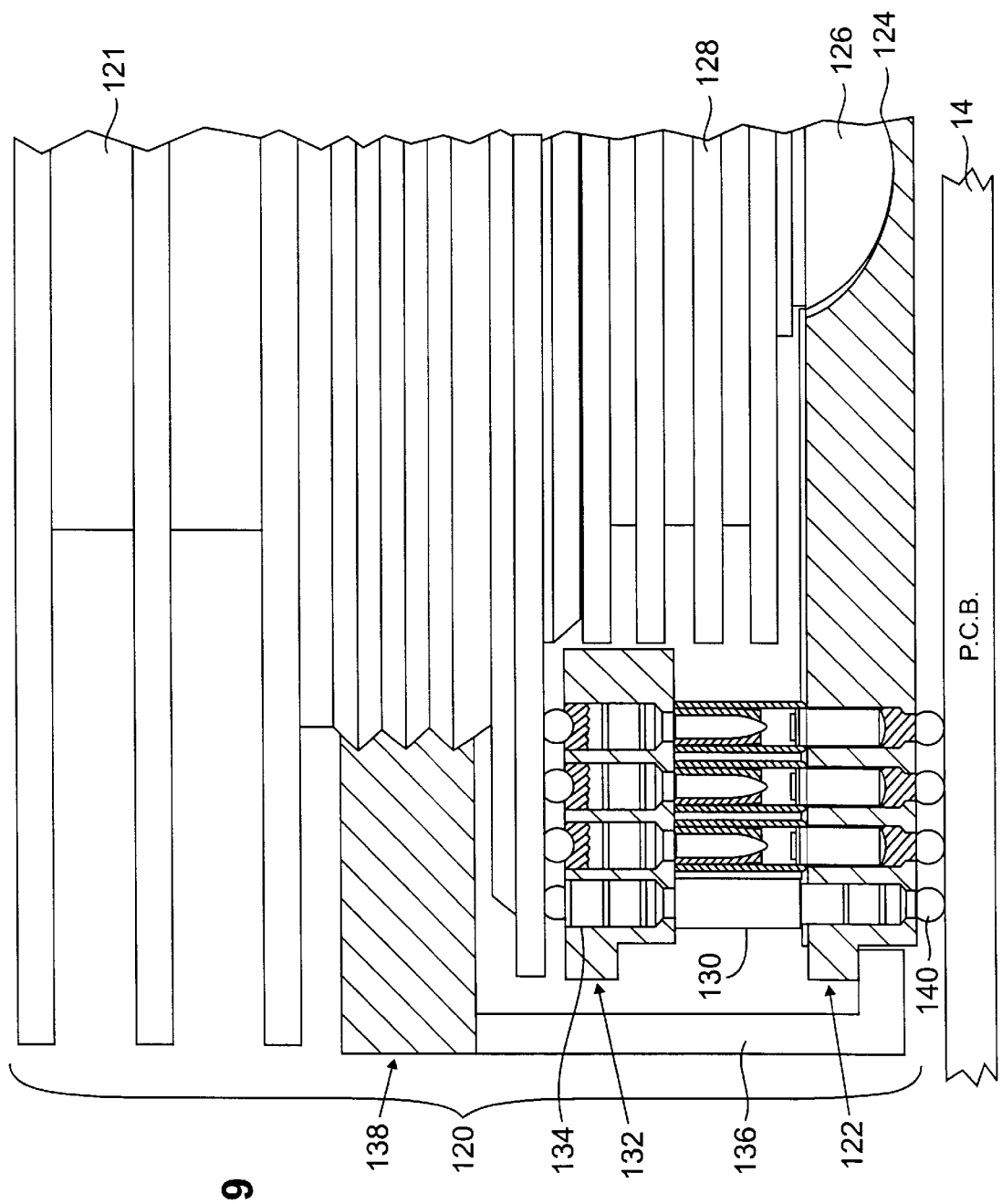
FIG. 9 is an alternative embodiment of an intercoupling component assembly.

Referring to FIG. 9, an intercoupling assembly 120 includes many of the same features as socket converter assembly 10 of FIGS. 1–7 and 8A–8C. For example, intercoupling assembly 120 includes an upper heat sink 121 and a socket assembly 122 having a concave-shaped cavity 124 for receiving a ball member 126 of a lower heat sink 128. Socket assembly 122 also includes an array of socket terminals 130 similar to socket terminals 18 of FIG. 2, except that coiled springs are not positioned within the socket terminals. Unlike the above described embodiment, intercoupling assembly also includes an adapter assembly 132 for supporting an array of male terminal pins 134 which are received within corresponding socket terminals 130 of socket assembly 122.

In this particular embodiment, lower heat sink 128 is of increased height to permit greater dissipation of heat. Thus, the height of intercoupling assembly 120 is also increased. In order to accommodate the relatively tall lower heat sink, the height of sidewalls 136 of a cover 138, is increased in proportion to the height of heat sink 128. In certain embodiments, the height of the sidewalls and the height of socket terminals 130 can both be increased to accommodate a tall lower heat sink. The increased length of socket terminals 130 has the additional benefit of providing greater heat dissipation through the socket terminals themselves as well as through solder balls 140 preattached to the terminals.

Figure 10:
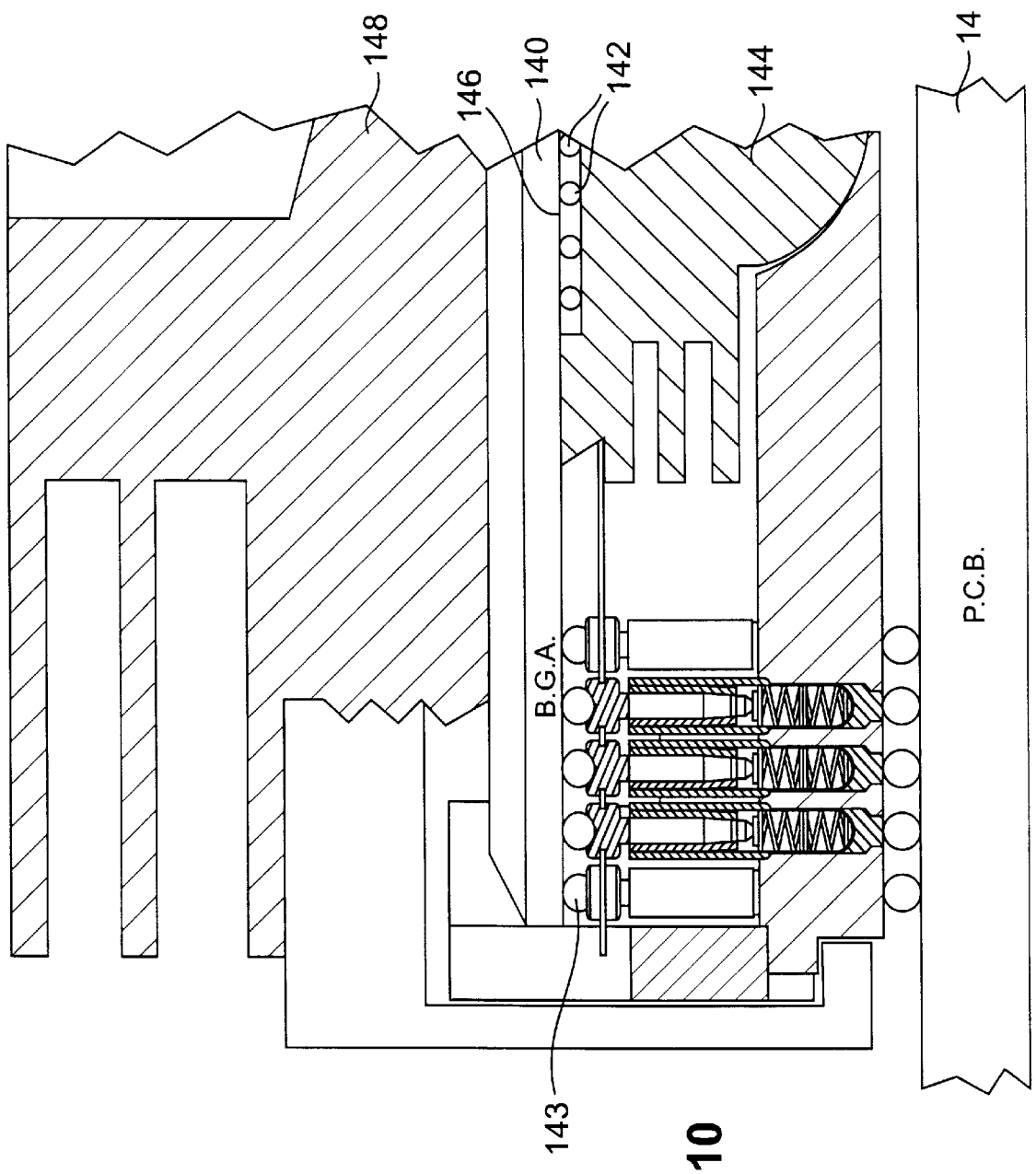
FIG. 10 is another alternative embodiment of an intercoupling component assembly.

Referring to FIG. 10, a BGA package 140 may include additional solder balls 142, independent of solder balls 143, electrically isolated from the internal circuitry (not shown) within the BGA package. Rather, additional solder balls 142 serve as miniature heat sinks for dissipating heat generated within BGA package 140. In these applications, a lower heat sink 144 may have a recess 146 formed in its upper surface so that contact between the lower heat sink 144 and those portions of the undersurface of BGA package 140 is maintained when an upper heat sink 148 is lowered to sandwich IC package 12. In the sandwiched position, solder balls 142 are positioned within recess 146 and provide a thermal path to lower heat sink 144.

It is also important to appreciate that use of a lower heat sink is beneficial for IC packages enclosing integrated circuits mounted in both the "chip-up" and "chip-down" arrangements, particularly, when both a lower and an upper heat sink is used to sandwich the IC package therebetween.

Still further embodiments are supported by the following claims.

What is claimed is:

1. An intercoupling component for electrically connecting electrical contacting areas of an integrated circuit package to corresponding connection regions of a substrate, the intercoupling component comprising:

a package support member including a plurality of openings extending from an upper surface to an opposite lower surface of the support member, the openings located in a pattern corresponding to a pattern of the contacting areas of the integrated circuit package; a plurality of contact terminals disposed within associated openings of the package for electrically connecting the contacting areas of the integrated circuit package to the corresponding connection regions of the substrate; and a heat sink, removable and replaceable within the package support member, the heat sink having a first surface for contacting a first surface of the integrated circuit package.

2. The intercoupling component of claim 1 further comprising a pivoting mechanism to allow the first surface of the heat sink to maintain flat-to-flat contact with the first surface of the integrated circuit package.

3. The intercoupling component of claim 2 wherein a second surface of the heat sink includes a projecting member and an adjoining surface of the support member includes a depression sized and shaped to receive the projecting member.

4. The intercoupling component of claim 3 wherein the depression is concave-shaped and the projecting member is rounded.

5. The intercoupling component of claim 1 wherein the first surface of the heat sink is an upper surface of the heat sink, and the first surface of the integrated circuit package is a lower surface of the package.

6. The intercoupling component of claim 5 wherein the package support member includes a central region within which the heat sink is disposed, the plurality of openings disposed along an outer periphery of the central region.

7. The intercoupling component of claim 5 further comprising a retaining member positioned to apply a downward force on the integrated circuit package.

8. The intercoupling component of claim 7 further comprising a rigid member positioned between the retaining member and integrated circuit package, the rigid member having peripheral sidewalls which contact peripheral regions of the integrated circuit package.

9. The intercoupling component of claim 7 wherein the retaining member includes a second heat sink having a surface contacting the upper surface of the integrated circuit package.

10. The intercoupling component of claim 5 wherein the package support member includes at least one aperture for providing air flow to the lower surface of the heat sink.

11. The intercoupling component of claim 5 further comprising an electrically insulative locator sheet including an aperture extending therethrough from an upper surface to an opposite lower surface of the locator sheet, the aperture positioned and sized to engage an upper peripheral portion of the heat sink.

12. The intercoupling component of claim 11 wherein the electrically insulative locator sheet includes openings extending therethrough from an upper surface to an opposite lower surface of the insulative locator sheet, the openings located in a pattern corresponding to a pattern of the contact terminals, the openings sized to allow the contact terminals to pass through the upper and lower surfaces of associated openings, whereby the contact terminals are aligned with associated connection regions having a pattern corresponding to a pattern of the contact terminals.

13. The intercoupling component of claim 11 wherein the locator sheet is a polyimide film.

14. The intercoupling component of claim 5 wherein each of the contact terminals includes:

a socket body having an upper end with an opening and a lower end configured to contact the corresponding connection region of the printed circuit board.

15. The intercoupling component of claim 14 wherein each of the contact terminals further includes:

a pin having an upper end adapted to contact the electrical contacting area of the integrated circuit package and a lower end configured to be inserted within the opening of the socket body.

16. The intercoupling component of claim 15 further comprising an adapter assembly disposed over the package support member, the adapter assembly including an electrically insulative support member having a plurality of holes extending from an upper surface to an opposite lower surface of the electrically insulative support member, the holes located in a pattern corresponding to a pattern of the contact terminals, each pin of the contact terminal disposed within an associated hole of the electrically insulative support member package.

17. The intercoupling component of claim 15 wherein the contact terminals further include:

a contact spring, disposed within a first end of the opening of the socket body, to receive and apply a frictional force sufficient to retain the lower end of the pin within the opening of the socket body; and a resilient member, disposed within a second, opposite end of the opening, to apply, to the lower end of the pin and in response to a downward force applied to the pin, an upward force sufficient to overcome the frictional force of the contact spring.

18. An intercoupling component for electrically connecting electrical contacting areas of an integrated circuit package to corresponding connection regions of a substrate, the intercoupling component comprising:

a package support member including a plurality of openings extending from an upper surface to an opposite lower surface of the support member, the openings located in a pattern corresponding to a pattern of the contacting areas of the integrated circuit package;

a plurality of contact terminals disposed within associated openings of the package for electrically connecting the contacting areas of the integrated circuit package to the corresponding connection regions of the substrate;

a heat sink supported on the package support member and having a first surface for contacting a first surface of the integrated circuit package; and a pivoting mechanism supporting the heat sink and allowing the first surface of the heat sink to maintain flat-to-flat contact with the first surface of the integrated circuit package.

19. The intercoupling component of claim 18 wherein a second surface of the heat sink includes a projecting member and an adjoining surface of the support member includes a depression sized and shaped to receive the projecting member.

20. The intercoupling component of claim 19 wherein the depression is concave-shaped and the projecting member is rounded.

21. The intercoupling component of claim 19 further comprising a retaining member positioned to apply a downward force on the integrated circuit package.

22. The intercoupling component of claim 21 further comprising a rigid member positioned between the retaining member and integrated circuit package, the rigid member having peripheral sidewalls which contact peripheral regions of the integrated circuit package.

23. The intercoupling component of claim 21 wherein the retaining member includes a second heat sink having a surface contacting the upper surface of the integrated circuit package.

24. The intercoupling component of claim 19 wherein the package support member includes at least one aperture for providing air flow to the lower surface of the heat sink.

* * * * *